United States Patent
Roy et al.

(10) Patent No.: US 9,419,088 B2
(45) Date of Patent: Aug. 16, 2016

(54) LOW RESISTANCE POLYSILICON STRAP

(71) Applicant: Freescale Semiconductor Inc., Austin, TX (US)

(72) Inventors: Anirban Roy, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/960,211

(22) Filed: Dec. 4, 2015

(65) Prior Publication Data

US 2016/0087057 A1 Mar. 24, 2016

Related U.S. Application Data

(62) Division of application No. 14/470,894, filed on Aug. 27, 2014, now Pat. No. 9,236,498.

(51) Int. Cl.

| | |
|---|---|
| *H01L 29/792* | (2006.01) |
| *H01L 29/423* | (2006.01) |
| *G11C 16/04* | (2006.01) |
| *H01L 21/28* | (2006.01) |
| *H01L 29/66* | (2006.01) |
| *H01L 29/788* | (2006.01) |
| *H01L 29/40* | (2006.01) |

(52) U.S. Cl.
CPC ...... *H01L 29/42344* (2013.01); *G11C 16/0425* (2013.01); *H01L 21/28273* (2013.01); *H01L 29/408* (2013.01); *H01L 29/42328* (2013.01); *H01L 29/66825* (2013.01); *H01L 29/7883* (2013.01); *H01L 29/792* (2013.01); *H01L 29/7885* (2013.01)

(58) Field of Classification Search
CPC ............ H01L 27/115; H01L 27/11521; H01L 21/28273; H01L 29/66825; H01L 29/42332; H01L 29/42336; H01L 29/66833; H01L 27/11556; H01L 21/28282; H01L 27/11568; H01L 2924/0002; H01L 29/42328; H01L 29/07; H01L 2924/00; H01L 2924/00014; H01L 27/1203; H01L 27/10864; H01L 27/10867; H01L 27/1087; H01L 2224/48247; H01L 27/105; H01L 29/66181; H01L 21/84; H01L 27/10829

See application file for complete search history.

(56) References Cited

U.S. PATENT DOCUMENTS

| | | | |
|---|---|---|---|
| 6,555,450 B2 | 4/2003 | Park et al. | |
| 7,057,235 B2 | 6/2006 | Lojek | |

FOREIGN PATENT DOCUMENTS

KR    20020048772 A    6/2002

OTHER PUBLICATIONS

Ko-Min Chang, "SG-TFS: a Versatile Embedded Flash with Silicon Nanocrystals as the Storage Medium," IEEE International Conference on Solid-State and Integrated Circuit Technology, 2008; 4 pgs.

*Primary Examiner* — Robert Bachner

(57) ABSTRACT

A low resistance polysilicon (poly) structure includes a first poly coupled to a substrate and having a sidewall. A second poly is separated from the sidewall of the first poly and the substrate by a programming oxide. The first poly and the second poly have substantially a same planarized height above the substrate. The first poly extends from a device region to a strap region, and extends substantially parallel to a first length of the second poly. A second length of the second poly extends away from the first poly in the strap region and includes a salicide. A first diffusion region crosses the first poly and the second poly in the device region. A masked width of the first length of the second poly is defined by an etched spacer. A low resistance contact is coupled to the second length of the second poly in the strap region.

10 Claims, 8 Drawing Sheets

STEP 122

STEP 124

STEP 126

STEP 128

STEP 130

STEP 122

STEP 124

STEP 126

STEP 128

STEP 130

STEP 132

FIG. 18 STEP 222
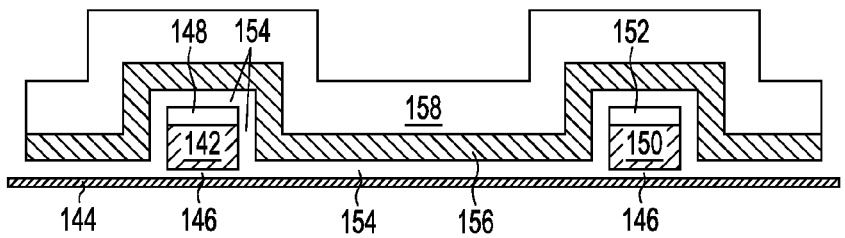
FIG. 19 STEP 224
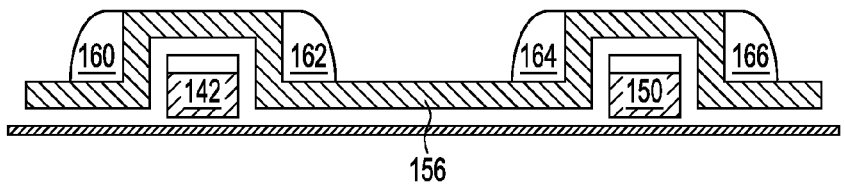
FIG. 20 STEP 226
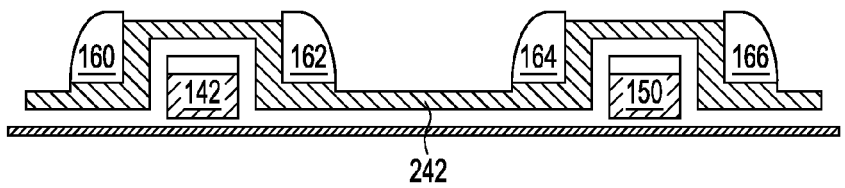
FIG. 21 STEP 228
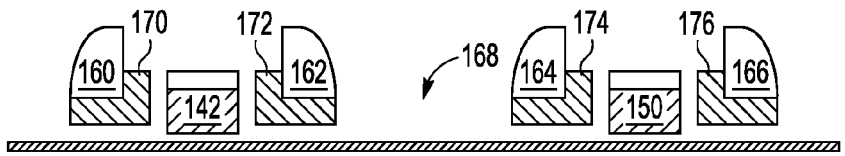
FIG. 22 STEP 230
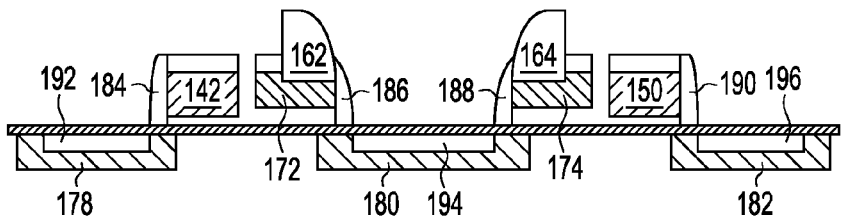
FIG. 23 STEP 232
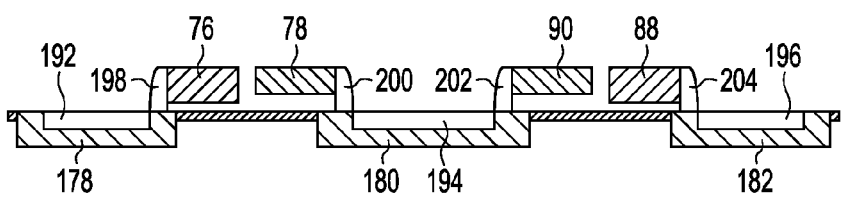

STEP 222

STEP 224

STEP 226

STEP 228

STEP 230

STEP 232

STEP 234

US 9,419,088 B2

LOW RESISTANCE POLYSILICON STRAP

CROSS-REFERENCE TO RELATED APPLICATIONS

This application claims the benefit of the filing date of allowed U.S. patent application Ser. No. 14/470,894, filed on Aug. 27, 2014, entitled, "Low Resistance Polysilicon Strap," the entirety of which is incorporated by reference herein.

FIELD

The invention relates generally to a polysilicon strap for a memory and more specifically to a manufacturing process and product for a low resistance gate strap in a semiconductor memory.

BACKGROUND

As semiconductor process technologies have continued to shrink in size, gate dielectrics used to form transistors and other active devices have suffered from increased leakage. Accordingly, new high dielectric constant (high-K) dielectrics were introduced that required polysilicon (poly) gates to be replaced with independently optimized thin work-function metals. Formation of these metal gates typically occurred after the source and drain regions were formed because of the high annealing temperatures used in the source and drain regions. The metal gate formation is called High-K Metal Gate (HKMG) or sometimes Replacement Metal Gate (RMG) because the poly used to mask or define the source and drain regions is exposed with a Chemical Mechanical Polish (CMP) and subsequently replaced with metal. The CMP exposes the sacrificial poly gate by a process called Poly Open Planarization (POP).

In an advanced embedded memory process, the logic devices use the HKMG process where the poly gate is replaced with metal, however the devices in the memory still require a poly gate due in part to the different gate oxide used by the memory devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 18 is a cross-section view of FIG. 4 taken along A-A', illustrating a process step for manufacturing the SG-TFS memory in accordance with step 222 of the flowchart of FIG. 17.

FIG. 19 is a cross-section view of FIG. 4 taken along A-A', illustrating a process step for manufacturing the SG-TFS memory in accordance with step 224 of the flowchart of FIG. 17.

FIG. 20 is a cross-section view of FIG. 4 taken along A-A', illustrating a process step for manufacturing the SG-TFS memory in accordance with step 226 of the flowchart of FIG. 17.

FIG. 21 is a cross-section view of FIG. 4 taken along A-A', illustrating a process step for manufacturing the SG-TFS memory in accordance with step 228 of the flowchart of FIG. 17.

FIG. 22 is a cross-section view of FIG. 4 taken along A-A', illustrating a process step for manufacturing the SG-TFS memory in accordance with step 230 of the flowchart of FIG. 17.

FIG. 23 is a cross-section view of FIG. 4 taken along A-A', illustrating a process step for manufacturing the SG-TFS memory in accordance with step 232 of the flowchart of FIG. 17.

DETAILED DESCRIPTION

Embodiments of systems and methods described herein provide for a low resistance contact to a polysilicon (poly) structure formed sufficiently close to an adjacent poly structure such that the use of a traditional contact pad to either poly is impeded. The contact to poly provides for a low resistance strap formed with metal. In one example, a split-gate nonvolatile Flash memory is formed by using a sidewall spacer to define a Control Gate (CG), which is adjacent to a poly Select Gate (SG). The spacing of the CG to the SG is defined by an oxide deposition step rather than by photolithographic patterning, hence the spacing can be reduced. Reduced spacing between the CG and the SG improves density. In one embodiment, a low impedance contact is made to the CG by extending a portion of the CG away from the SG and using a silicide on the extended poly (e.g. polycide) to make a low impedance contact to the polycide strap. In another embodiment, a salicide process is used to form a polycide strap. A further challenge exists with the use of a low impedance contact to the polycide strap, when the CG is part of an embedded memory in a process including logic devices formed with the HKMG process. The CG and SG poly gates in the memory are exposed with the same POP process used to in the logic portion of the embedded memory process. A mask is used to block the removal of the poly strap during the formation of the sidewall spacers. In another embodiment, a partial etch back of the poly strap is used to prevent excessive silicide removal during the POP process, which could contaminate the slurry used with the CMP process and could also corrupt the CMP polish rate.

Figure 1:
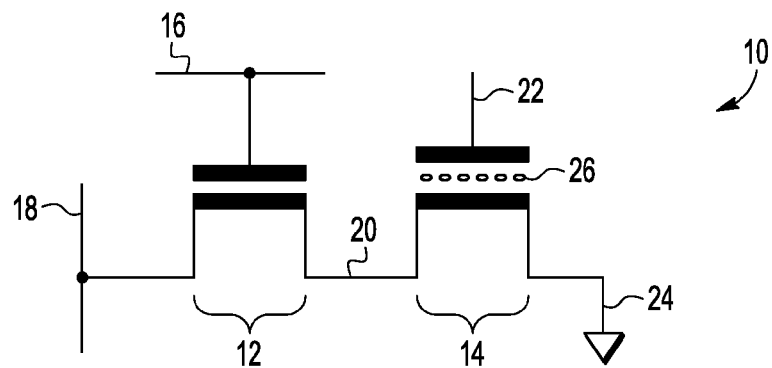
FIG. 1 is a schematic view of a non-volatile memory cell.

FIG. 1 shows an embodiment of a split-gate nonvolatile memory 10 including an access transistor 12 and a storage device 14. The access transistor 12 is activated by an SG 16 connected to a word-line, which connects a bit-line 18 to a node 20. The storage device 14 is biased to one of several bias levels by a CG 22, which conditionally connects the node 20 to a ground 24 depending on an amount of charge stored in a storage layer 26. In one example, charge is deposited on the storage layer 26 with hot electron injection, while in another example, Fowler-Nordheim tunneling is used. In one embodiment, the storage layer is formed using nanocrystals. The CG 22 is biased to a programming level when charge is desired to be stored in the storage layer 26 and another level when the memory is read. During a READ operation, a bias on the CG 22 will conditionally allow conduction between the node 20 and ground 24 based on an amount of threshold shifting that occurs in the storage device 14 from charge stored in the storage layer 26.

Figure 2:
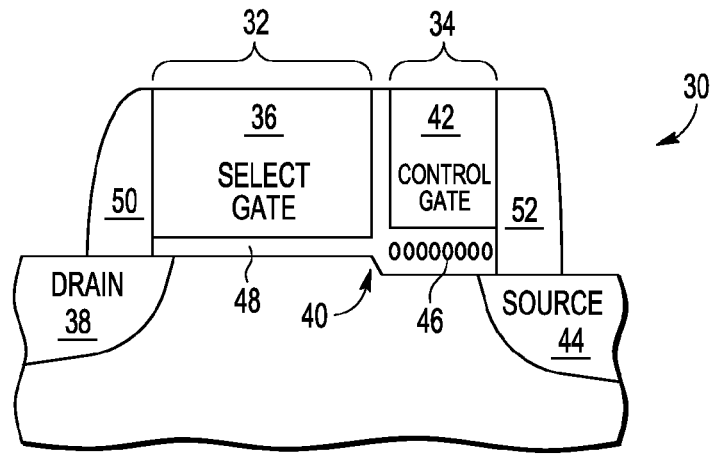
FIG. 2 is a process cross-section view of a Split-Gate Nanocrystal memory cell fabricated with a Thin Film Storage process (SG-TFS).

FIG. 2. shows a process cross-section of the SG-TFS memory 30 according to one embodiment of the present disclosure. Similar to the embodiment 10 in FIG. 1, the SG-TFS memory 30 includes an access transistor 32 and a storage device 34. The access transistor 32 includes an SG 36 (connected to a word-line), which controls conduction between a drain 38 (connected to a bit-line), and a channel 40. A CG 42 is biased to control conduction between the channel 40 and a source 44, based on a modified threshold of the storage device 34 as a result of trapped charge on the nanocrystals 46. The SG 36 is separated from the channel 40 by a thin gate oxide 48. The SG-TFS memory 30 also has sidewall spacers 50 and 52 designed, in part, to minimize the overlap of respective gates SG 36 over the drain 38 and the CG 42 over the source 44.

Figure 3:
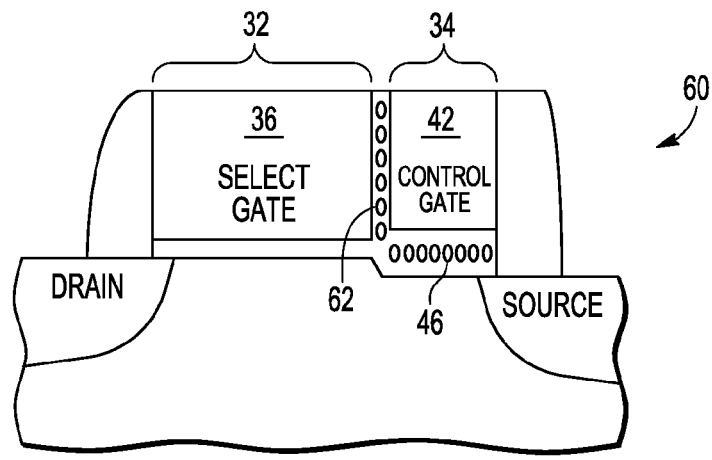
FIG. 3 is a process cross-section view of an SG-TFS memory.

FIG. 3 is a process cross-section of an alternate embodiment of the SG-TFS memory 60. The SG-TFS memory 60 is similar to the memory 30 but with the addition of nanocrystals 62 interposed between the SG 36 and the CG 42. The SG-TFS memory 60 provides for a simplified process over that used to form the memory 30 in FIG. 2 because the nanocrystals 46 and 62 are deposited in the same process step, without the need to mask the deposition of nanocrystals 62. Furthermore, charge deposition on the nanocrystal 62 is minimal and has minimal effect on the bias on the SG 3 and the CG 42, both of which are driven from low impedance sources. The memory 30 of FIG. 2 and the memory 60 of FIG. 3 are suitable for an advance MOS process with feature sizes of 28 nm or less but are adaptable to other process geometries as well. In one embodiment, the memory 30 and memory 60 are formed in a CMOS process, although NMOS or other MOS processes are also envisioned within the scope of this disclosure.

Figure 4:
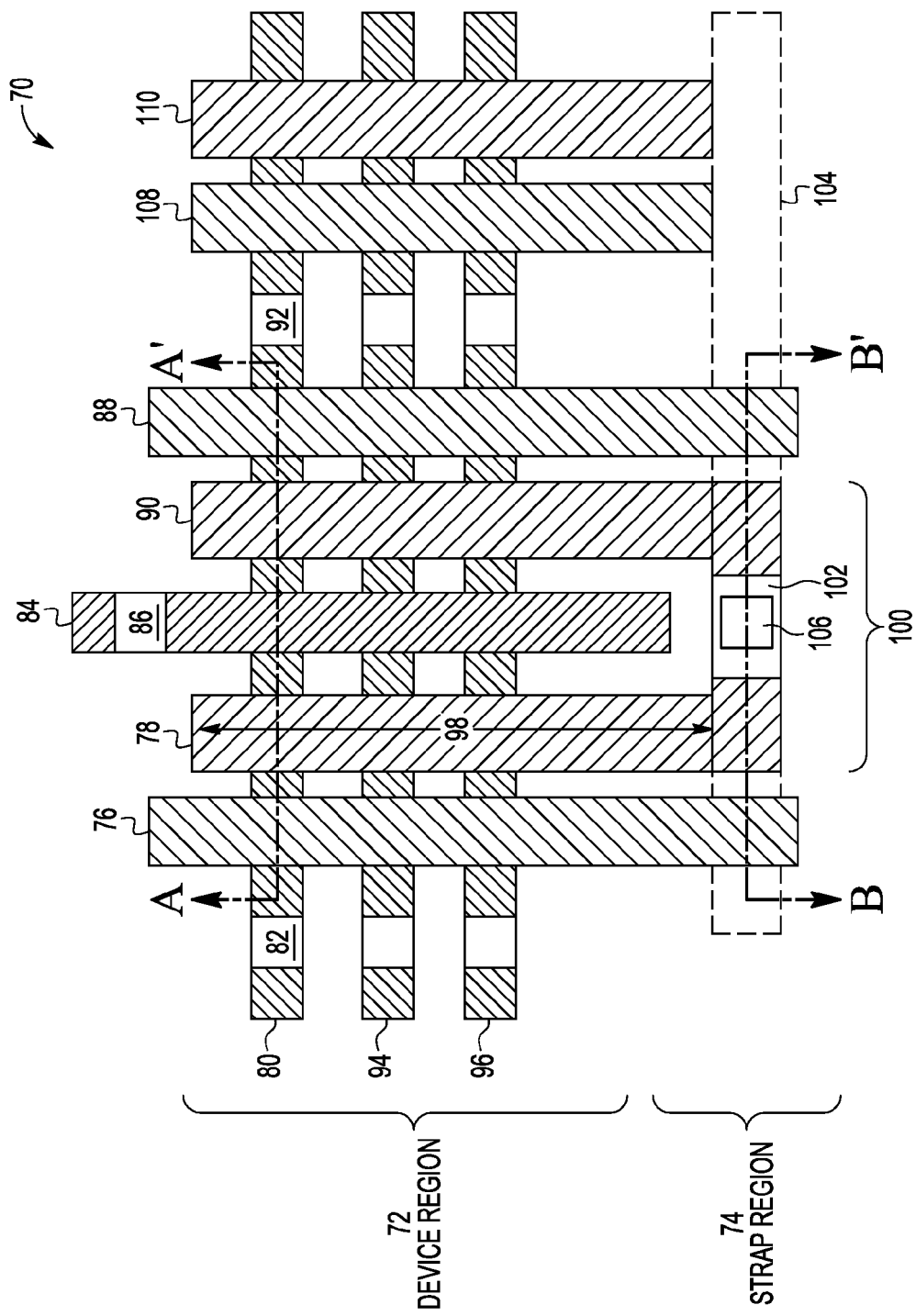
FIG. 4 is a planar view of a portion of an SG-TFS memory array.

FIG. 4 is a planar view of a portion of the SG-TFS memory 70 shown in either FIG. 2 or FIG. 3. The memory 70 includes a device region 72 where active devices are formed and a strap region 74 where a low impedance strap between adjacent gates is formed. An SG 76 and a CG 78 run parallel to each other extending from the device region 72 to the strap region 74. A diffusion region 80 crosses the SG 76 and the CG 78 forming transistor at the respective intersections. For example, with reference to FIG. 2, FIG. 3 and FIG. 4, the diffusion 80 defines an area where the drain 38 and the source 44 are formed. The SG 76 is similar to the SG 36 and the CG 78 is similar to the CG 42. A contact 82 connects the diffusion 80 region similar to the drain 38 to a bit-line to transport data to a sensing circuit during a READ operation and from a write driver during a PROGRAM operation. A common source diffusion 84 extends substantially parallel to the SG 76 and the CG 78 to provide a region similar to the source 44. A contact 86 connects the diffusion 84 to a low impedance source metal line.

The memory 70 has symmetry about the diffusion 84, with the common source diffusion 84 being shared by a second SG 88 and a CG 90. The formation and operation of the SG 88 and the CG 90 are the similar to the aforementioned SG 76 and the CG 78. The SG 88 and the CG 90 conditionally connect (e.g. depending on a stored state) diffusion 84 to contact 92. Contact 92 is connected to the same bit-line metal connected to contact 82. The SG 76, the CG 78, the SG 88 and the CG 90 form one pair of memory cells with diffusion 80, a second pair of memory cells with a diffusion 94 extending parallel to diffusion 80 and a third pair of memory cells with a diffusion 96 extending parallel to diffusion 94. Numerous pairs of memory cells are thus formed sharing a common word-line with the SG 76 and the SG 88.

The CG 78 has a first length 98 extending substantially parallel to the SG 76. The CG 78 also has a length of poly extending away from the SG 76 and connecting to the adjacent CG 90 to provide a poly strap 100. In one embodiment, the strap 100 is substantially orthogonal to the SG 76. The poly strap 100 has a low impedance silicided region (e.g. polycide). A mask 104 prevents the poly strap 100 from being removed during a poly etch step. In one embodiment, the mask 104 is a loose tolerance and relatively inexpensive mask (compared to other masks). A low impedance contact is made to the polycide region 102 to provide low impedance routing to the CG (used for establish bias levels for programming and read operations).

The area provided by the polycide 102 permits a contact that will not short to, or otherwise interfere, with the SG 76 or SG 88. The contact 106 further enables the use of a metal conductor of sufficient width and cross-sectional area to permit fast charging of the CG 78 and CG 90 when the metal line strapping the CGs is energized with fast changing signals specially during memory verify operations. The strap 100 also reduces the size of a decoder for driving the CG 78 and the CG 90 because the pitch between contacts 106 is increased, thereby allowing for a more compact and efficient decoder design. The symmetry of the memory cells about the common source 84 is repeated about the bit-line contact 92 with an SG 108 and a CG 110.

While the structures shown in FIG. 4 are applied to shorting and providing low impedance contacts to CG gates, the similar structures are envisioned to be applied to the SG gates, for example with memories that use twin bit storage. Twin bit storage uses a pair of memory cells, typically adjacent to one another, to store both a logical "1" and a logical "0" state. In another embodiment, efficiently providing for a low resistance contact to a poly formed by a sidewall spacer, is provided for a dynamic random access memory (DRAM) where the CG is replaced by a bias plate of a storage capacitor.

Figure 5:
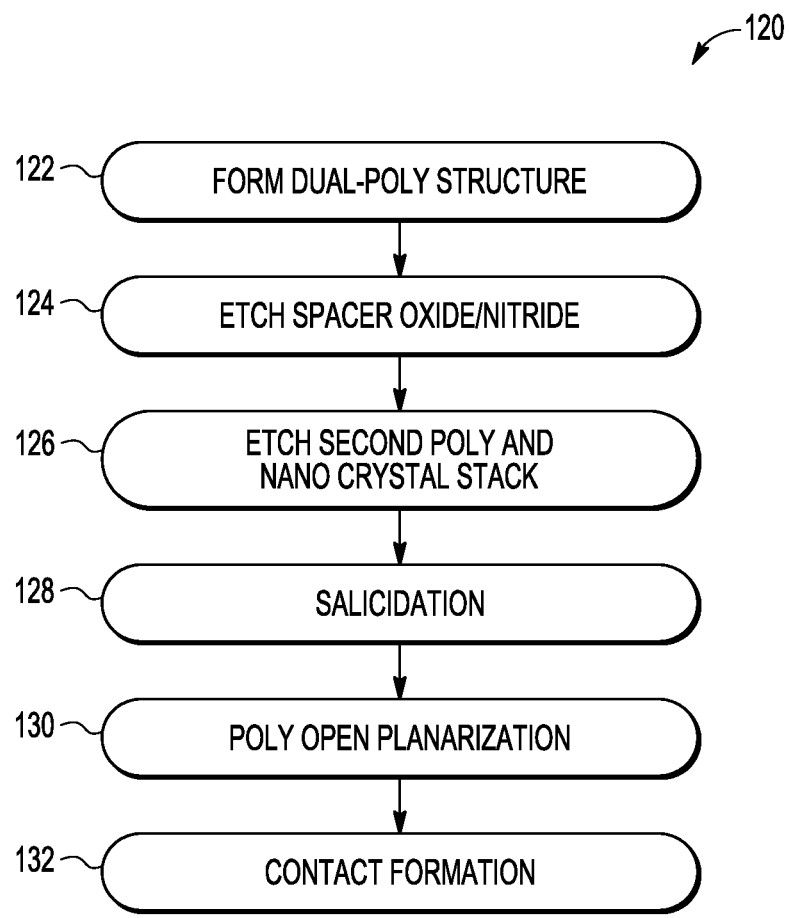
FIG. 5 is flowchart representation of a method for manufacturing the SG-TFS memory according to one embodiment of the present disclosure.

FIG. 5 is a flowchart of a process 120 to form a low resistance polysilicon strap in an embodiment where the CMP used for POP is tolerant of silicide components contaminating the CMP slurry. At step 122 a structure with two poly layers is formed. Specifically a first poly layer is formed using a gate poly flow (e.g. gate poly), and a second poly is formed on top of the first poly separated by an oxide including nanocrystals (e.g. a nanocrystal stack). At step 124, a spacer is formed by etching a layer including a combination of oxide and nitride (e.g. an Oxide/Nitride layer). At step 126, the second poly and nanocrystal stack are etched. At step 128, a salicidation step deposits salicide on diffusions, the gate poly and the second poly. At step 130, a POP process exposes the top surface of the gate poly and the second poly at substantially the same height above the substrate. At step 132, a contact is formed in the strap region 74.

FIG. 6 through FIG. 10 are cross-sectional views taken along A-A' in the device region 72 of the memory 70 of FIG. 4, illustrating the process steps of the process 120 of FIG. 5. The process 120 begins with step 122, shown in FIG. 6, where a structure with two poly layers is formed. A gate poly 142 is formed over a substrate 144 and separated by a thin gate oxide 146. In one embodiment, a nitride cap 148 is formed on top of the gate poly 142 to protect the gate poly 142 from oxidation. Similarly, a gate poly 150 is formed over the substrate 144, separated by the thin gate oxide 146. In one embodiment, the gate poly 150 has a nitride cap 152. A nanocrystal stack 154 is formed over the sidewalls of the gate polys 142 and 150, over the nitride caps 148 and 152 and over the substrate 144 between the gate poly 142 and 150. A second poly 156 is formed over the nanocrystal stack. An Oxide/Nitride layer 158 is then formed over the second poly 156.

Figure 7:
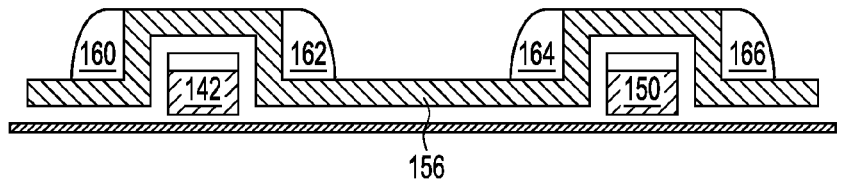
FIG. 7 is a cross-section view of FIG. 4 taken along A-A', illustrating a process step for manufacturing the SG-TFS memory in accordance with step 124 of the flowchart of FIG. 5.

At step 124, shown in FIG. 7, the Oxide/Nitride layer 158 is etched to form sidewall spacers 160 and 162 on either side of the gate poly 142, and sidewall spacers 164 and 166 on either side of the gate poly 150. At step 126, shown in FIG. 8, the second poly and the nanocrystal stack 154 are etched. Specifically, the second poly 156 and nanocrystal stack 154 are removed from the region 168 between the gate poly 142 and 150, and are removed from the overlying region previously covering the gate poly 142 and 150. The remaining portions of the second poly 170 and 172 on either side of the gate poly 142, and the portions 174 and 176 on either side of the gate poly 150 are etched to a height above the substrate 144 roughly corresponding to the top surface of the nitride caps 148 and 152.

Figure 9:
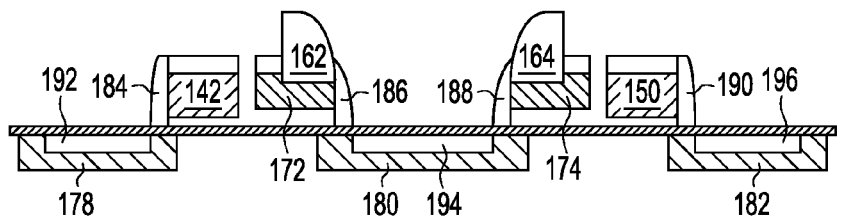
FIG. 9 is a cross-section view of FIG. 4 taken along A-A', illustrating a process step for manufacturing the SG-TFS memory in accordance with step 128 of the flowchart of FIG. 5.

At step 128, shown in FIG. 9, the sidewall spacers 160 and 166 are removed as are the portions of the second poly 170 and 176. The diffusion regions 178, 180 and 182 are then formed. Additional spacers 184, 186, 188 and 190 are formed on the gate poly 142, the portion of the second poly 172, the portion of the second poly 174 and the gate poly 150 respectively. Subsequently, the diffusions 178, 180 and 182 are covered with a salicide 192, 194 and 196 respectively. The portions of the second poly 172 and 174 are also coated with a salicide.

Figure 10:
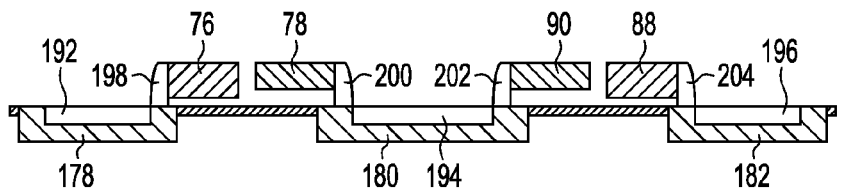
FIG. 10 is a cross-section view of FIG. 4 taken along A-A', illustrating a process step for manufacturing the SG-TFS memory in accordance with step 130 of the flowchart of FIG. 5.
Figure 11:
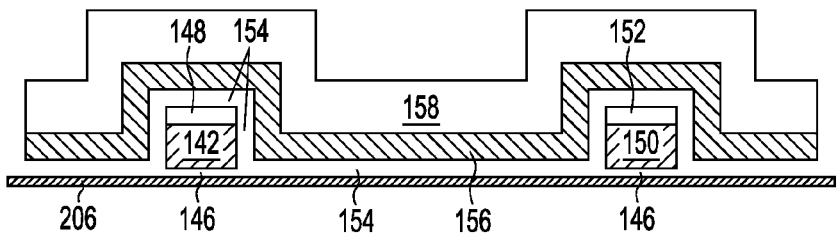
FIG. 11 is a cross-section view of FIG. 4 taken along B-B', illustrating a process step for manufacturing the SG-TFS memory in accordance with step 122 of the flowchart of FIG. 5.
Figure 12:
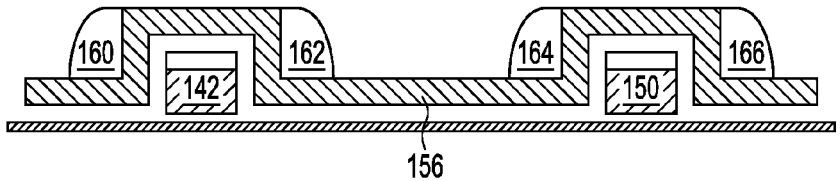
FIG. 12 is a cross-section view of FIG. 4 taken along B-B', illustrating a process step for manufacturing the SG-TFS memory in accordance with step 124 of the flowchart of FIG. 5.

At step 130, shown in FIG. 10, the POP process removes the sidewall spacers 162 and 164 by planarizing the portions of the second poly 172 and 174 respectively. The gate poly 142 and 150 are similarly planarized with the POP process. The resulting second poly structures 78 and 90, (as shown in FIG. 4), are thereby formed with a spacing to adjacent gate poly structures 76 and 88, (also shown in FIG. 4) defined by the thickness of the nanocrystal stack 154. This process flow results in a dense structure with the SG and CG spaced closer to each other than possible with photolithographic means.

Figure 6:
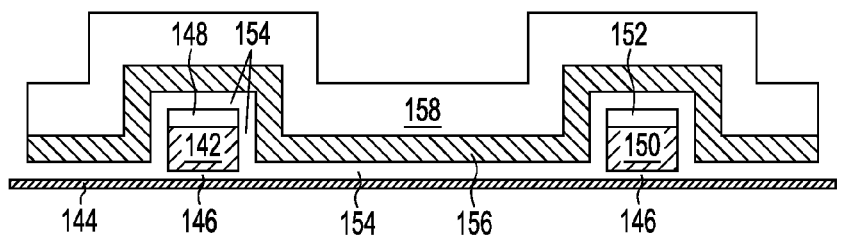
FIG. 6 is a cross-section view of FIG. 4 taken along A-A', illustrating a process step for manufacturing the SG-TFS memory in accordance with step 122 of the flowchart of FIG. 5.

FIG. 11 through FIG. 16 are cross-sectional views taken along B-B' in the strap region 74 of the memory 70 of FIG. 4, illustrating the process steps of the process 120 of FIG. 5. The process 120 begins at FIG. 11 with the formation of a two-layer poly structure over a polished Shallow Trench Isolation (STI) 206, in a similar manner as shown in FIG. 6. At step 124, shown in FIG. 12, the Oxide/Nitride layer 158 is etched to form sidewall spacers in the same manner as shown in FIG. 7.

Figure 8:
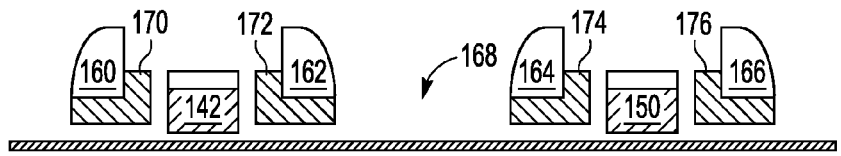
FIG. 8 is a cross-section view of FIG. 4 taken along A-A', illustrating a process step for manufacturing the SG-TFS memory in accordance with step 126 of the flowchart of FIG. 5.
Figure 13:
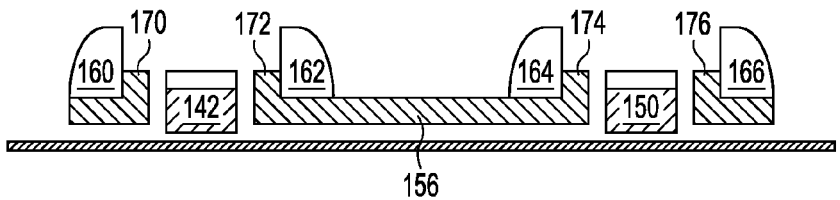
FIG. 13 is a cross-section view of FIG. 4 taken along B-B', illustrating a process step for manufacturing the SG-TFS memory in accordance with step 126 of the flowchart of FIG. 5.

The step 126, shown in FIG. 13, differs from that shown in FIG. 8, in that the etching of the second poly 156 and the nanocrystal stack 154 are blocked between the two gate poly structures 142 and 150 by a mask 104 (shown in FIG. 4). Accordingly, the second poly 156 between the two gate poly structures 142 and 150 remains the same between step 124 and step 126.

Figure 14:
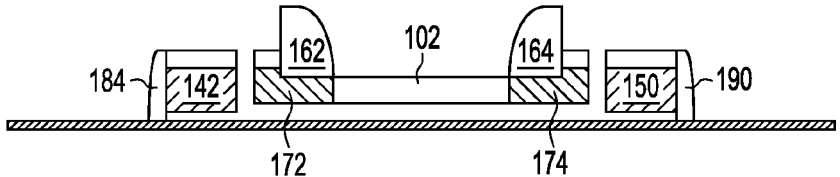
FIG. 14 is a cross-section view of FIG. 4 taken along B-B', illustrating a process step for manufacturing the SG-TFS memory in accordance with step 128 of the flowchart of FIG. 5.
Figure 15:
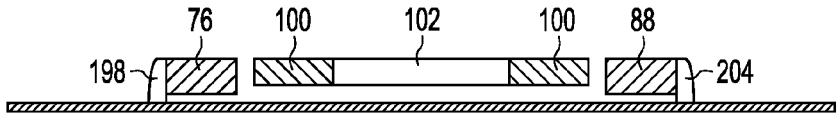
FIG. 15 is a cross-section view of FIG. 4 taken along B-B', illustrating a process step for manufacturing the SG-TFS memory in accordance with step 130 of the flowchart of FIG. 5.
Figure 16:
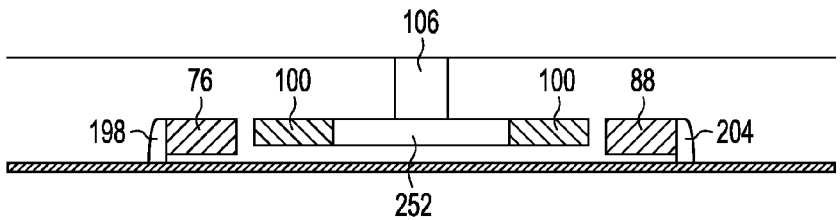
FIG. 16 is a cross-section view of FIG. 4 taken along B-B', illustrating a process step for manufacturing the SG-TFS memory in accordance with step 132 of the flowchart of FIG. 5.

The step 128, shown in FIG. 14, adds a salicide 102 to the second poly 156 to form a low resistance portion of the second poly 156. This step 128 is performed at the same time as the step 128 shown in FIG. 9, however there is no diffusion in the strap region 74, so salicide only affects the second poly 156. The step 130, shown in FIG. 15 is similar to the step 130 shown in FIG. 10, whereby the POP process planarizes the gate poly 76 and 88, the strap 100 formed by the second length of the second poly 156 and the salicided region 102 (e.g. polycide) of the strap 100. The step 132, shown in FIG. 16 concludes the process flow 120 by adding a contact 106 to the salicided region 102.

Figure 17:
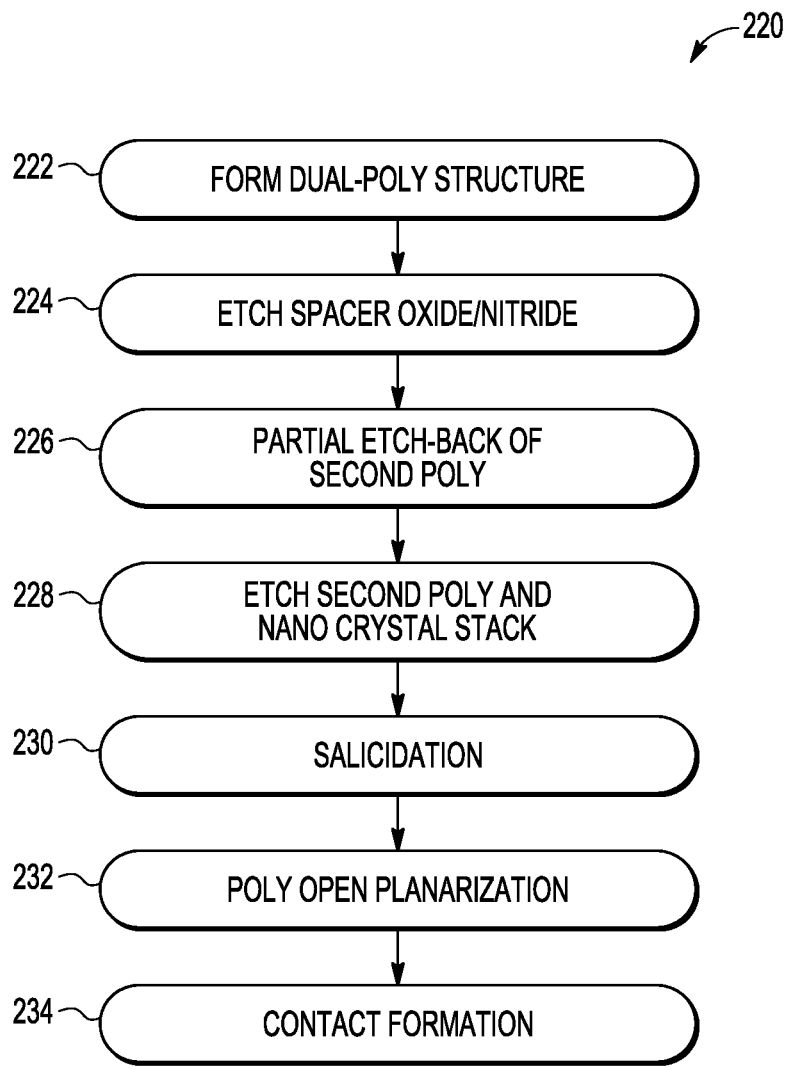
FIG. 17 is flowchart representation of a method for manufacturing the SG-TFS memory according to another embodiment of the present disclosure.
Figure 24:
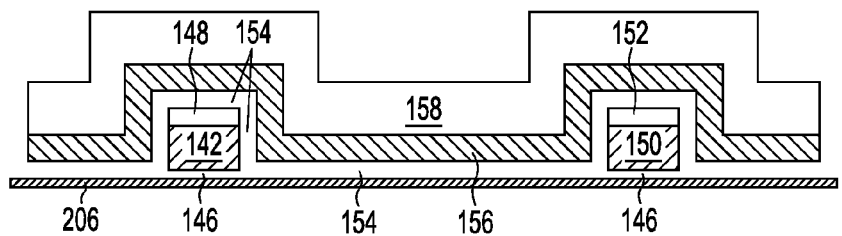
FIG. 24 is a cross-section view of FIG. 4 taken along B-B', illustrating a process step for manufacturing the SG-TFS memory in accordance with step 222 of the flowchart of FIG. 17.
Figure 25:
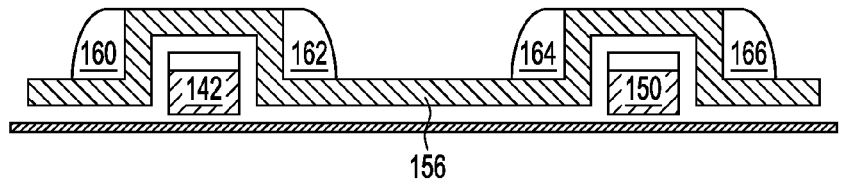
FIG. 25 is a cross-section view of FIG. 4 taken along B-B', illustrating a process step for manufacturing the SG-TFS memory in accordance with step 224 of the flowchart of FIG. 17.
Figure 26:
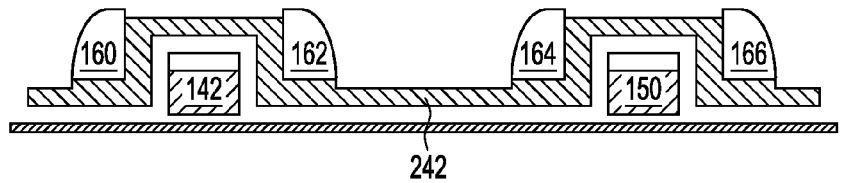
FIG. 26 is a cross-section view of FIG. 4 taken along B-B', illustrating a process step for manufacturing the SG-TFS memory in accordance with step 226 of the flowchart of FIG. 17.

FIG. 17 is a flowchart of a process 220 to form a low resistance polysilicon strap in an embodiment where the CMP used for POP is not tolerant of substantive levels of silicide components contaminating the CMP slurry. The process 220 is similar to the process 120, shown in FIG. 5, but with the addition of a partial etch back step that recesses the salicide of the strap 100 so that the slurry used in the POP planarization step does not get contaminated by removing a portion of the salicide on the strap 100.

At step 222 a structure with two poly layers is formed. Specifically a first poly layer is formed using a gate poly flow (e.g. gate poly), and a second poly is formed on top of the first poly separated by an oxide including nanocrystals (e.g. a nanocrystal stack). At step 224, a spacer is formed by etching a layer including a combination of oxide and nitride (e.g. an Oxide/Nitride layer). At step 226, a partial etch-back of the second poly is performed. In one embodiment, the amount of etch back is designed to be equal to or greater than the variation in CMP planarization depth during the POP process.

At step 228, the second poly and nanocrystal stack are etched. At step 230, a salicidation step deposits salicide on diffusions, the gate poly and the second poly. At step 232, a POP process exposes the top surface of the gate poly and the second poly at substantially the same height above the substrate. At step 234, a contact is formed in the strap region 74.

FIG. 18 through FIG. 23 are cross-sectional views taken along A-A' in the device region 72 of the memory 70 of FIG. 4, illustrating the process steps of the process 220 of FIG. 17. The step 222, shown in FIG. 18 forms a two-layer poly structure in the same manner as shown in FIG. 6. At step 224, shown in FIG. 19, the Oxide/Nitride layer 158 is etched to form sidewall spacers in the same manner as shown in FIG. 7. At step 226, shown in FIG. 20, the second poly 156 is etched back to form a thin second poly 242, in the region between the gate poly 142 and 150. In one embodiment, the second poly 156 is also thinned over the gate poly 142 and 150. At step 228, shown in FIG. 21, the thinned second poly 242 and the nanocrystal stack 154 are etched, to produce a similar structure as shown in FIG. 8. Step 230, shown in FIG. 22, follows a similar flow and produces a similar structure to that shown in FIG. 9. At step 232, shown in FIG. 23, the POP process removes the sidewall spacers 162 and 164 by planarizing the portions of the second poly 172 and 174 respectively, in the same manner as shown in FIG. 10. The gate poly 142 and 150 are similarly planarized with the POP process, in the same manner as shown in FIG. 10.

FIG. 24 through FIG. 30 are cross-sectional views taken along B-B' in the strap region 74 of the memory 70 of FIG. 4, illustrating the process steps of the process 220 of FIG. 17. The process 220 begins at FIG. 24 with the formation of a two-layer poly structure over a polished STI 206 in a similar manner as shown in FIG. 18. At step 224, shown in FIG. 25, the Oxide/Nitride layer 158 is etched to form sidewall spacers in the same manner as shown in FIG. 19. At step 226, shown in FIG. 26, the second poly 156 is etched back to form a thin second poly 242, in the same manner shown in FIG. 20.

Figure 27:
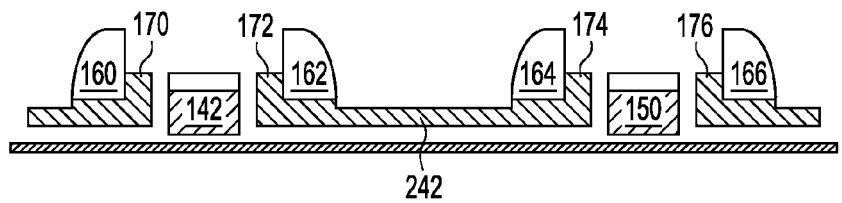
FIG. 27 is a cross-section view of FIG. 4 taken along B-B', illustrating a process step for manufacturing the SG-TFS memory in accordance with step 228 of the flowchart of FIG. 17.

The step 228, shown in FIG. 27, differs from that shown in FIG. 21, in that the etching of the thinned second poly 242 and the nanocrystal stack 154 are blocked between the two gate poly structures 142 and 150 by a mask 104 (shown in FIG. 4). Accordingly, the thinned second poly 242 between the two gate poly structures 142 and 150 remains the same between step 226 and step 228.

Figure 28:
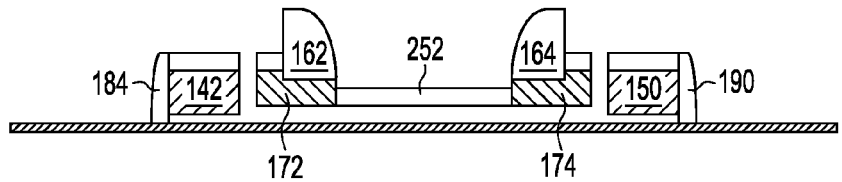
FIG. 28 is a cross-section view of FIG. 4 taken along B-B', illustrating a process step for manufacturing the SG-TFS memory in accordance with step 230 of the flowchart of FIG. 17.
Figure 29:
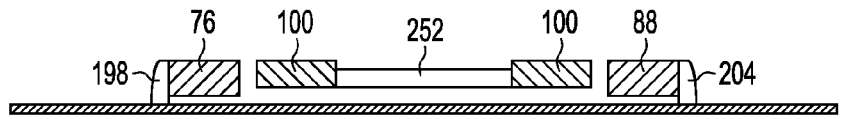
FIG. 29 is a cross-section view of FIG. 4 taken along B-B', illustrating a process step for manufacturing the SG-TFS memory in accordance with step 232 of the flowchart of FIG. 17.
Figure 30:
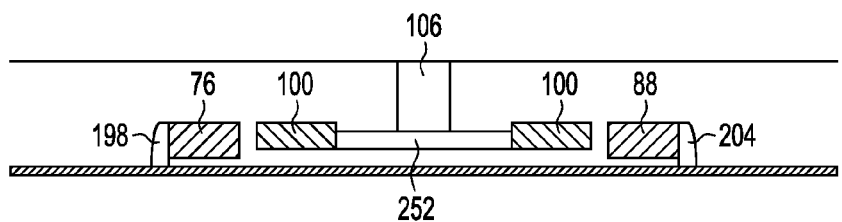
FIG. 30 is a cross-section view of FIG. 4 taken along B-B', illustrating a process step for manufacturing the SG-TFS memory in accordance with step 234 of the flowchart of FIG. 17.

The step 230, shown in FIG. 28, adds a salicide 252 to the thinned second poly 242 to form a low resistance portion of the thinned second poly 242. This step 230 is performed at the same time as the step 230 shown in FIG. 22, however there is no diffusion in the strap region 74, so salicide only affects the thinned second poly 242. The step 232, shown in FIG. 29 is similar to the step 232 shown in FIG. 23, whereby the POP process planarizes the gate poly 76 and 88, the strap 100 formed by the second length of the thinned second poly 242 and the salicided region 252 (e.g. polycide) of the strap 100. The step 234, shown in FIG. 30 concludes the process flow 220 by adding a contact 106 to the salicided region 252.

As will be appreciated, embodiments as disclosed include at least the following. In one embodiment, a method for manufacturing a low resistance polysilicon (poly) strap comprises fabricating a structure including a first poly coupled to a substrate. The first poly has a top surface and a sidewall. A nanocrystal stack separates a second poly from the top surface of the first poly, the sidewall of the first poly and the substrate. An insulator substantially coats a first surface of the second poly. The second poly separates the insulator from the nanocrystal stack. The first poly extends from a device region to a strap region. The first poly extends substantially parallel to a first length of the second poly. A second length of the second poly extends away from the first poly in the strap region. A first diffusion region crosses the first poly and the second poly in the device region. The insulator is etched to form a spacer. The spacer defines a masked width of the first length of the second poly. The masked width extends from the nanocrystal stack, separating the second poly from the sidewall of the first poly, to a second diffusion region being substantially parallel to the second poly and contained in the device region. The second poly excluded by the spacer in the device region is etched to leave a masked width of the first length of the second poly. The second poly excluded by a mask in the strap region is etched to leave the second length of the second poly. A salicide is formed on at least the second length of the second poly. The second poly is planarized to a second depth by substantially removing the spacer. The first poly is planarized to a first depth substantially the same as the second depth. A contact is formed with the second length of the second poly in the strap region.

Alternative embodiments of the method for manufacturing a low resistance poly strap include one of the following features, or any combination thereof. The structure is fabricated in an embedded memory process. The structure is fabricated in a high-K metal gate process. The first poly is patterned with a lithographic feature size of no more than 28 nanometers. Planarizing includes polishing with a chemical mechanical polish. A nitride cap is formed on the top surface of the first poly.

In another embodiment, a low resistance poly strap comprises fabricating a structure including a first poly coupled to a substrate. The first poly has a top surface and a sidewall. A programming oxide separates a second poly from the top surface of the first poly, the sidewall of the first poly and the substrate. An insulator substantially coats a first surface of the second poly. The second poly separates the insulator from the programming oxide. The first poly extends from a device region to a strap region. The first poly extends substantially parallel to a first length of the second poly. A second length of the second poly extends away from the first poly in the strap region. A first diffusion region crosses the first poly and the second poly in the device region. The insulator is etched to form a spacer. The spacer defines a masked width of the first length of the second poly. The masked width extends from the programming oxide, separating the second poly from the sidewall of the first poly, to a second diffusion region being substantially parallel to the second poly and contained in the device region. The second poly is partially etched to an etchback depth. The second poly excluded by the spacer in the device region is etched to leave a masked width of the first length of the second poly. The second poly excluded by a mask in the strap region is etched to leave the second length of the second poly. A salicide is formed on at least the second length of the second poly. The second poly is planarized to a second depth by substantially removing the spacer. The first poly is planarized to a first depth substantially the same as the second depth. A contact is formed with the second length of the second poly in the strap region.

Alternative embodiments of the method for manufacturing a low resistance poly strap include one of the following features, or any combination thereof. The structure is fabricated in an embedded memory process with logic devices. The structure is fabricated in a high-K metal gate process. Planarizing includes polishing with a chemical mechanical polish.

In another embodiment, a low resistance poly structure comprises a first poly coupled to a substrate. The first poly has a sidewall. A second poly is separated from the sidewall of the first poly and the substrate by a programming oxide. The first poly and the second poly have substantially a same planarized height above the substrate. The first poly extends from a device region to a strap region. The first poly extends substantially parallel to a first length of the second poly. A second length of the second poly extends away from the first poly in the strap region and includes a salicide. A first diffusion region crosses the first poly and the second poly in the device region. A masked width of the first length of the second poly is defined by an etched spacer extending from the programming oxide, separating the second poly from the sidewall of the first poly, to a second diffusion region being substantially parallel to the second poly and contained in the device region. A low resistance contact is couple to the second length of the second poly in the strap region.

Alternative embodiments of the low resistance poly structure include one of the following features, or any combination thereof. The programming oxide is configured to store a state of a non-volatile memory in a high-K metal gate embedded memory process. The first poly forms a select gate of a memory and the second poly forms a control gate of the memory. The programming oxide is a nanocrystal stack. The programming oxide is an Oxide-Nitride-Oxide (ONO) stack. The first diffusion crosses the first poly and the second poly at a substantially orthogonal angle. The second length of the second poly extends to a third poly of an adjacent memory structure. The first diffusion region and the second diffusion region are N-type. At least a portion of the second length of the second poly has a recessed height less than the planarized height of the first poly and the second poly. A difference between the recessed height and the planarized height is greater than a variation in a chemical mechanical polish process used to planarize the first poly and the second poly.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A low resistance polysilicon (poly) structure comprising:
   a first poly coupled to a substrate, the first poly having a sidewall;
   a second poly separated from the sidewall of the first poly and the substrate by a programming oxide, the first poly and the second poly having substantially a same planarized height above the substrate, the first poly extending from a device region to a strap region, the first poly extending substantially parallel to a first length of the second poly, a second length of the second poly extending away from the first poly in the strap region and including a salicide, a first diffusion region crossing the first poly and the second poly in the device region, a masked width of the first length of the second poly defined by an etched spacer; and
   a low resistance contact coupled to the second length of the second poly in the strap region.

2. The structure of claim 1 wherein the programming oxide is configured to store a state of a non-volatile memory in a high-K metal gate embedded memory process.

3. The structure of claim 1 wherein the first poly forms a select gate of a memory and the second poly forms a control gate of the memory.

4. The structure of claim 1 wherein the programming oxide is a nanocrystal stack.

5. The structure of claim 1 wherein the programming oxide is an Oxide-Nitride-Oxide (ONO) stack.

6. The structure of claim 1 wherein the first diffusion crosses the first poly and the second poly at a substantially orthogonal angle.

7. The structure of claim 1 wherein the second length of the second poly extends to a third poly of an adjacent memory structure.

8. The structure of claim 1 wherein the first diffusion region is N-type.

9. The structure of claim 1 wherein at least a portion of the second length of the second poly has a recessed height less than the planarized height of the first poly and the second poly.

10. The structure of claim 9 wherein a difference between the recessed height and the planarized height is greater than a variation in a chemical mechanical polish process used to planarize the first poly and the second poly.

* * * * *